(12) United States Patent
Hao et al.

(10) Patent No.: US 9,655,056 B2
(45) Date of Patent: May 16, 2017

(54) METHOD AND APPARATUS FOR ADJUSTING TRANSMISSION POWER OF TERMINAL AS WELL AS THE TERMINAL

(71) Applicant: ZTE CORPORATION, Shenzhen (CN)

(72) Inventors: Yanbo Hao, Shenzhen (CN); Tao Zhong, Shenzhen (CN); Zhiqiang Hou, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 15/029,972

(22) PCT Filed: Feb. 19, 2014

(86) PCT No.: PCT/CN2014/072273
§ 371 (c)(1),
(2) Date: Apr. 15, 2016

(87) PCT Pub. No.: WO2014/154068
PCT Pub. Date: Oct. 2, 2014

(65) Prior Publication Data
US 2016/0270001 A1    Sep. 15, 2016

(30) Foreign Application Priority Data

Oct. 15, 2013   (CN) .......................... 2013 1 0481863

(51) Int. Cl.
*H04W 52/18*   (2009.01)
*H04W 52/04*   (2009.01)
(Continued)

(52) U.S. Cl.
CPC ............ *H04W 52/18* (2013.01); *G01R 29/10* (2013.01); *H01Q 1/245* (2013.01);
(Continued)

(58) Field of Classification Search
CPC ............................ H04W 52/283; H04L 43/10
(Continued)

(56) References Cited

U.S. PATENT DOCUMENTS

2013/0130633 A1* 5/2013 Lin .................. H01Q 1/245
455/127.1
2014/0315592 A1* 10/2014 Schlub ................ H04B 1/3838
455/522

(Continued)

FOREIGN PATENT DOCUMENTS

| CN | 101980564 A | 2/2011 |
|---|---|---|
| CN | 103179653 A | 6/2013 |
| WO | 2015030810 A1 | 3/2015 |

OTHER PUBLICATIONS

International Search Report from PCT/CN2014/072273 dated Jul. 21, 2014 (2 pgs).

(Continued)

*Primary Examiner* — John J Lee
(74) *Attorney, Agent, or Firm* — Calfee, Halter & Griswold LLP

(57) ABSTRACT

A method for adjusting transmission power of a terminal includes: acquiring a distance between a human body and the terminal; retrieving, from a prestored table indicative of correspondence between distances and power adjustment values, a power adjustment value corresponding to the distance between the human body and the terminal; and adjusting transmission power of the terminal based on the power adjustment value. According to the method for adjusting transmission power of the terminal provided by the disclosure, antenna power output by the terminal is adjusted in real time according to the current distance between the human body and the terminal.

9 Claims, 2 Drawing Sheets

(51) Int. Cl.
*H04M 1/737* (2006.01)
*G01R 29/10* (2006.01)
*H01Q 1/24* (2006.01)
*H04B 1/3827* (2015.01)

(52) U.S. Cl.
CPC .......... *H04B 1/3838* (2013.01); *H04M 1/737* (2013.01); *H04W 52/04* (2013.01); *H04M 2250/12* (2013.01)

(58) Field of Classification Search
USPC ......... 455/522, 69, 127.1, 126, 67.11, 456.1, 455/456.3, 456.6
See application file for complete search history.

(56) References Cited

U.S. PATENT DOCUMENTS

| | | | |
|---|---|---|---|
| 2015/0171911 A1* | 6/2015 | Yang | H04B 1/3838 455/280 |
| 2016/0165551 A1* | 6/2016 | Lagnado | H04L 43/10 370/311 |

OTHER PUBLICATIONS

Written Opinion from PCT/CN2014/072273 dated Jul. 21, 2014 (7 pgs).
Australian Office Action dated Dec. 22, 2016, 2 pages.

* cited by examiner

METHOD AND APPARATUS FOR ADJUSTING TRANSMISSION POWER OF TERMINAL AS WELL AS THE TERMINAL

CROSS-REFERENCE TO RELATED APPLICATION

This application is a National Phase Application of International Application PCT/CN2014/072273, with an international filing date of Feb. 19, 2014, which is based on and claims priority to Chinese Patent Application No. 201310481863.0, filed on Oct. 15, 2013, the entire contents of which are incorporated herein by reference.

TECHNICAL FIELD

The present disclosure generally relates to fields of wireless communication, and more particularly, to a method and an apparatus for adjusting transmission power of a terminal as well as the terminal.

BACKGROUND

As a kind of necessary tool in people's daily life, mobile terminals play a more and more important role in life, and more attention have been paid to security of the mobile terminals in daily use. When using a mobile terminal, especially for purpose of conversation, a user may be subject to electromagnetic radiation from an antenna(s) of the mobile terminal. Unfortunately, research has increasingly suggested that excessive electromagnetic radiation may cause variety of illness, or even may be life-threatening. Accordingly, increasingly strict standards are proposed against the antenna(s) of the mobile terminal in different countries, so as to reduce harm of electromagnetic radiation therefrom to human body. In general, an SAR (Specific Absorption Rate) value is an important indicator for measuring the electromagnetic radiation, and standards are established for the antenna(s) of the mobile terminal according the SAR value in the countries, where only those mobile terminals conforming to the standards are permitted for sale.

In order to reduce electromagnetic radiation on human body from an antenna(s) of a mobile terminal, existing manufactures of the mobile terminal may implement proper adjustment of an antenna structure by applying wave-absorbing material or introducing additional wave director(s)/reflector(s) in the mobile terminal so as to reduce the SAR value of the antenna, such that the standard of antenna on electromagnetic radiation can be met. In adoption of the method mentioned above, however, reduction of the electromagnetic radiation from the antenna(s) of the mobile terminal is limited, and the SAR value of the antenna cannot be reduced efficiently. On the other side, transmission power of the antenna(s) may drop too much when overmuch attention is paid to reduce the SAR value of the antenna(s), such that the mobile terminal may be not used normally during its application of conversation or internet service.

Therefore, a method for efficiently reducing electromagnetic radiation from an antenna of a mobile terminal according to actual application is in urgent need.

SUMMARY

In view of above, the disclosure is directed to provide a method and an apparatus for adjusting transmission power of a terminal as well as the terminal.

According to a first aspect of embodiments of the disclosure, there is provided a method for adjusting transmission power of a terminal, including:

acquiring a distance between a human body and the terminal;

retrieving, from a prestored table indicative of correspondence between distances and power adjustment values, a power adjustment value corresponding to the distance between the human body and the terminal; and adjusting transmission power of the terminal based on the power adjustment value.

In an embodiment, the acquiring a distance between a human body and the terminal includes: acquiring the distance between the human body and the terminal by using a sensor provided in the terminal.

In an embodiment, the table includes distances between the human body and the terminal and corresponding power adjustment values.

In an embodiment, the retrieving, from a prestored table indicative of correspondence between distances and power adjustment values, a power adjustment value corresponding to the distance includes:

determining whether the distance is smaller than a maximum distance recorded in the table to obtain a result;

rounding the distance when the result indicates that the distance is smaller than the maximum distance recorded in the table, and returning to the acquiring the distance between the human body and the terminal when the result indicates otherwise; and retrieving a power adjustment value corresponding to a rounded distance from the table.

In an embodiment, the distance between the human body and the terminal is a closest distance between the human body and a strongest radiation point of the terminal.

According to a second aspect of embodiments of the disclosure, there is provided an apparatus for adjusting transmission power of a terminal, including:

an acquiring module configured to acquire a distance between a human body and the terminal;

a retrieve module configured to retrieve, from a prestored table indicative of correspondence between distances and power adjustment values, a power adjustment value corresponding to the distance between the human body and the terminal; and an adjustment module configured to adjust transmission power of the terminal based on the power adjustment value.

In an embodiment, the acquiring module is configured to acquire the distance between the human body and the terminal by using a sensor provided in the terminal.

In an embodiment, the table includes distances between the human body and the terminal and corresponding power adjustment values.

In an embodiment, the retrieve module is configured to determine whether the distance is smaller than a maximum distance recorded in the table to obtain a result, round the distance when the result indicates that the distance is smaller than the maximum distance recorded in the table, return to the acquire the distance between the human body and the terminal when the result indicates otherwise; and retrieve a power adjustment value corresponding to a rounded distance from the table.

In an embodiment, the distance between the human body and the terminal is a closest distance between the human body and a strongest radiation point of the terminal.

According to a third aspect of embodiments of the disclosure, there is provided a terminal, including the apparatus for adjusting transmission power of the terminal.

According to a fourth aspect of embodiments of the disclosure, there is provided an apparatus for adjusting transmission power of a terminal, comprising:

a processor; and a memory configured to store instructions executable by the processor;

wherein, the processor is configured to perform: acquiring a distance between a human body and the terminal;

retrieving, from a prestored table indicative of correspondence between distances and power adjustment values, a power adjustment value corresponding to the distance between the human body and the terminal; and adjusting transmission power of the terminal based on the power adjustment value.

According to a fifth aspect of embodiments of the disclosure, there is provided a non-transitory computer-readable storage medium having stored therein instructions that, when executed by a processor of a terminal, causes the terminal to perform a method for adjusting transmission power, the method including:

acquiring a distance between a human body and the terminal;

retrieving, from a prestored table indicative of correspondence between distances and power adjustment values, a power adjustment value corresponding to the distance between the human body and the terminal; and adjusting transmission power of the terminal based on the power adjustment value.

It is to be understood that both the foregoing general description and the following detailed description are exemplary and explanatory only and are not restrictive of the invention, as claimed.

BRIEF DESCRIPTION OF THE DRAWINGS

For purpose of clear description of technical solution in embodiments of the disclosure or in related art, a brief description is made as follows to drawings as required in describing embodiments or related art. It should be noted that, the drawings to be described hereinbelow are merely illustrative of some embodiments of the disclosure, and additional drawings can be obtained based thereon by those skilled in the art without inventive work.

DETAILED DESCRIPTION

Objects, technical solution and advantageous effects of the present disclosure will become more apparent through following detailed description of embodiments with reference to drawings. The embodiments are representative of only a part of embodiments of the disclosure rather than being exhaustive. Based on the embodiments described herein, other embodiments obtained by those skilled in the art without inventive work fall within protection scope of the invention.

Figure 1:
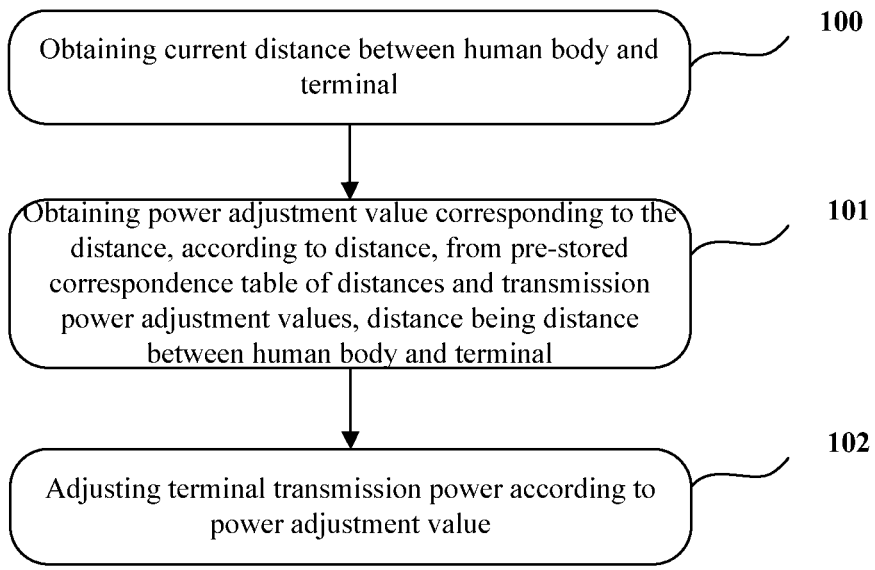
FIG. 1 is a flow chart illustrating a method for adjusting transmission power of a terminal according to an embodiment.

As shown in FIG. 1, the method for adjusting transmission power of a terminal according to an embodiment of the disclosure includes following steps.

In step 100, a distance between a human body and the terminal is acquired.

In step 101, a power adjustment value corresponding to the distance between the human body and the terminal is retrieved from a prestored table indicative of correspondence between distances and power adjustment values according to the distance.

In step 102, transmission power of the terminal is adjusted based on the power adjustment value.

According to the steps described above, antenna power output by the terminal is adjusted in real time such that a user can be protected from radiation of an antenna by adjusting transmission power of the antenna within a required range of SAR value without affecting normal use of the terminal.

In an embodiment, the distance between the human body and the terminal is a closest distance between the human body and a strongest radiation point of the terminal.

The method according to the embodiment may be applied in a variety of terminals including but not limited to various devices having an antenna(s) and being capable of transmitting electromagnetic radiation signal, for example, mobile terminals such as cell phones, tablet computers, and portable computers, and smart household appliances such as microwave ovens, induction cookers and radios. A brief description of the method will be given as follows.

When the method described in the embodiment is applied in a mobile terminal, the distance to the human body is acquired by a sensor provided in the mobile terminal, and a power adjustment value corresponding to the acquired distance is retrieved. Then, transmission power of an antenna is adjusted by the mobile terminal according to the power adjustment value, and antenna signal will be transmitted based on the adjusted transmission power. In this way, a user of the mobile terminal can be protected from radiation harm of the antenna.

When the method described in the embodiment is applied in a smart household appliance, a case in which a microwave oven is taken as an example will be described. In use of the microwave oven for heating food, a distance to a user is acquired by the microwave through a sensor provided therein. After that, a power adjustment value corresponding to the acquired distance is retrieved, and power of electromagnetic wave transmitted from a magnetron is adjusted based on the retrieved power adjustment value at the microwave oven. Then, electromagnetic wave for heating food will be transmitted according to the adjusted power. In this way, the user can be protected from harm of electromagnetic wave transmitted from the microwave oven such that human safety can be ensured.

Therefore, in the embodiment, the distance between the terminal and the human body can be acquired precisely by the sensor provided in the terminal such that accuracy of power adjustment can be ensured.

In an embodiment of the sensor, a distance sensor already existed in the terminal can be used to measure the distance between the terminal and the human body. Typically, measurement precision of the distance sensor has reached up to millimeter (mm) level, thus is sufficient to achieve desirable accuracy for measurement of the distance. Moreover, measurement of the distance between the terminal and the human body can be performed by existing device in the terminal without added manufacturing cost of the terminal.

As an existing method for reducing electromagnetic radiation of terminals, an antenna structure is typically modified by applying wave-absorbing material or introducing additional wave director(s)/reflector(s). Such method, however, will cause additional cost of the terminal and change of antenna wiring, and a circuit layout of the terminal should be redesigned. In general, when the SAR value is used as an indicator of radiation level for a current distance between the human body and the terminal, damage to the human body caused by electromagnetic radiation with an SAR value not greater than 1 can be ignored. Accordingly, in an embodiment, distances between the terminal and the human body for which the SAR value is greater than 1 may be measured in millimeters (mm), and a distance for which the SAR value is just over 1 and the corresponding SAR value are recorded. Then, transmission power of the terminal antenna is reduced until the SAR value is less than 1 under the distance, and an adjustment value of power is recorded.

Finally, a correspondence between distances and power adjustment values is stored in form of a mapping table in the terminal such that output power of the antenna can be adjusted by the terminal according to records of the mapping table.

Experimental measurement results show that the SAR value increases as the distance between the human body and the terminal get closer and, correspondingly, the value of power adjustment to be performed become greater. In an embodiment, when the distance between the human body and the terminal is 0 mm, the power adjustment value is 4.5 dB; when the distance between the human body and the terminal is 1 mm, the power adjustment value is 4 dB; when the distance between the human body and the terminal is 2 mm, the power adjustment value is 3.5 dB; and so on, when the distance between the human body and the terminal is 8 mm, the power adjustment value is 0.5 dB; when the distance between the human body and the terminal is greater than 8 mm, there is no need to adjust the transmission power of the terminal antenna.

As can be seen from above, a step value of power adjustment is 0.5 dB, because a transmission state of the antenna may be unstable and no evident effect of adjustment is generated when the step value is less than 0.5 dB.

Measurement results are recorded in the mapping table containing distances between the human body and the terminal and corresponding power adjustment values.

According to the embodiment, the output power of antenna in the terminal can be adjusted easily based on records of the mapping table without changing design of the terminal antenna or additional spare/wiring area in the antenna. Thus, there is no impact on the circuit layout of the terminal, and a brief operation is available with a simple mechanism.

As another existing method for reducing electromagnetic radiation of terminals, transmission power of a terminal antenna is reduced as predefined when it is detected that a user is conducting conversation or internet service using the terminal. By such method, however, radiation strength of the terminal antenna can be reduced for only one time, and is usually reduced so much that normal use of conversation or internet service may be affected.

Therefore, in an embodiment, the power adjustment value corresponding to the distance is retrieved, from the prestored table indicative of correspondence between distances and power adjustment values, by:

determining whether the distance is smaller than a maximum distance recorded in the mapping table to obtain a result;

rounding the distance if the result indicates that the distance is smaller than the maximum distance recorded in the mapping table, or otherwise, returning to step 100 for acquiring the distance between the human body and the terminal; and retrieving a power adjustment value corresponding to a rounded distance from the mapping table.

According to the operations described above, output power of the antenna may be not adjusted until the terminal determines that the distance between the human body and the terminal falls within a distance scope recorded in the mapping table. Furthermore, signal transmission strength of the terminal is adjusted in real time according to the distance to the human body, such that the human body can be protected from electromagnetic radiation of the terminal while ensuring normal use of conversation or internet service.

The method for adjusting transmission power of terminal will be described further in detail with reference to the following embodiment.

Figure 2:
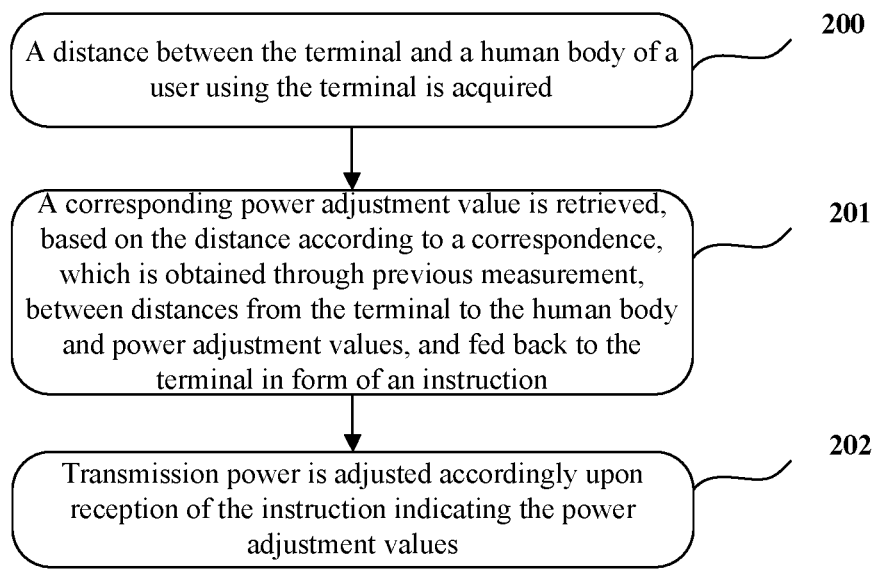
FIG. 2 is a flow chart illustrating a method for adjusting transmission power of a terminal according to another embodiment.

FIG. 2 is a flow chart illustrating a method for adjusting transmission power of a terminal. As shown in FIG. 2, the method includes following steps.

In step 200, a distance between the terminal and a human body of a user using the terminal is acquired.

In step 201, a corresponding power adjustment value is retrieved, based on the distance according to a correspondence, which is obtained through previous measurement, between distances from the terminal to the human body and power adjustment values, and fed back to the terminal in form of an instruction.

In step 202, transmission power is adjusted accordingly upon reception of the instruction indicating the power adjustment values.

For a conventional terminal having SAR-reducing function, there must be a sensor (that is, an SAR-reducing antenna) for detecting a distance between a human body and the terminal provided in the terminal, which can be directly used for detection of the distance between the human body and the terminal. Otherwise, if no SAR-reducing function is built-in, a sensor needs to be added to the terminal before it functions.

In an embodiment, the correspondence between distances from the terminal to the human body and power adjustment values may be obtained in the laboratory due to a very high precision requirement of the SAR value measurement, in which even a test error of 30% is allowed for a single device being tested in different laboratories. For this reason, a test result obtained in the laboratory is used so as to approach real condition as close as possible. Moreover, according to requirements of SAR, correspondence between distances and power adjustment values may be sorted out in a list to be input to the terminal for use.

In actual use by the user, the distance from the human body to the terminal is measured by the sensor in the terminal, the corresponding power adjustment value is retrieved from the list, and a corresponding output power is then determined according to the power adjustment value.

Depending on both testing environment of the laboratory and actual practice effect, the SAR value may be measured in millimeters as a basic unit. If a step value is so great that a preset upper threshold of step value is exceeded, the actual practice effect may deteriorate obviously. On the other side, if the step value is so small that a preset lower threshold is exceeded, it is unable to perform accurate measurement due to limit of laboratory condition, and precision of transmission power control of the terminal (e.g. a cell phone) cannot reach that level.

The adjustment of transmission power based on the correspondence between measured SAR values and distances may be regulated in consideration of specific requirements of various customers. For example, there is a huge difference between CE standard in Europe and FCC standard in United States. According, the transmission power may be regulated based on obtained data while taking actual conditions into consideration.

The distance obtained by the terminal may be a closest distance between the human body and a strongest radiation point of the terminal.

The step value of final power adjustment performed by the terminal may be 0.5 dB, because an unstable state and an obviously increasing error may be generated when the step value is less than 0.5 dB.

According to the present embodiment, adjusted power output by the terminal is determined based on the closest distance between the human body and the strongest radiation point of the terminal, such that SAR test requirement (including harmlessness) can be met without compromising performance of antenna radiation. In this way, an optimum balance can be resulted between OTA (Over-the-Air Technology) and SAR certification, avoiding radical operations such as excessive enhancement of OTA, which causes overstandard of SAR, or excessive focus on SAR certification, which causes performance degradation of the antenna radiation.

For implementation of the method provided in the embodiment, in terms of hardware design, no additional hardware needs to be introduced compared with the conventional terminal with the SAR-reducing function, only appropriate adjustment of the sensor is needed, so little or no additional cost pressure will be caused; and in terms of antenna design, there is no requirement for extra spare or wiring area of antenna, so the layout of terminal will not be affected. The embodiment is of open-loop control, simple mechanism and brief operation.

As can be seen from above description, according to the method for adjusting transmission power of the terminal provided by the embodiment, the current distance between the human body and the terminal is acquired, the power adjustment value corresponding to the distance is retrieved, and the transmission power of the antenna is then reduced based on the retrieved power adjustment value. In this way, antenna power output by the terminal is adjusted in real time according to the current distance between the human body and the terminal such that transmission power of the terminal antenna can be adjusted to be provided with a SAR value conforming to prescribed standard, for protection purpose of the user from antenna radiation, without influencing normal use of the terminal. Moreover, there is no requirement for extra spare or wiring area of antenna in terms of antenna design, so the circuit layout of terminal will not be affected, and a brief operation is available with a simple mechanism.

Figure 3:
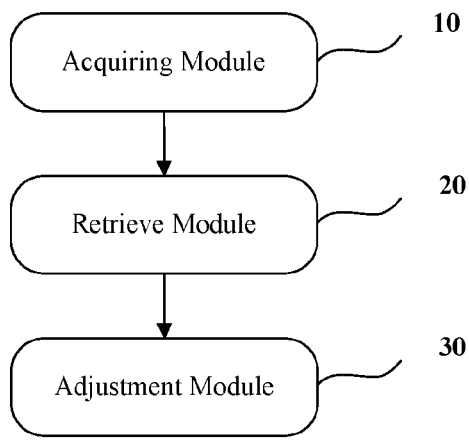
FIG. 3 is a block diagram illustrating an apparatus for adjusting transmission power of a terminal according to an embodiment.

FIG. 3 is a block diagram illustrating an apparatus for adjusting transmission power of a terminal according to an embodiment. As shown in FIG. 3, the apparatus includes:

an acquiring module 10 configured to acquire a distance between a human body and the terminal;

a retrieve module 20 configured to retrieve, from a prestored mapping table indicative of correspondence between distances and power adjustment values, a power adjustment value corresponding to the distance between the human body and the terminal; and an adjustment module 30 configured to adjust transmission power of the terminal based on the power adjustment value.

In an embodiment, the acquiring module 10 is configured to acquire the distance between the human body and the terminal by using a sensor provided in the terminal.

In an embodiment, the mapping table includes distances between the human body and the terminal and corresponding power adjustment values.

In an embodiment, the retrieve module 20 is configured to determine whether the distance is smaller than a maximum distance recorded in the mapping table to obtain a result; round the distance when the result indicates that the distance is smaller than the maximum distance recorded in the table, or otherwise return to acquire the distance between the human body and the terminal; and retrieve a power adjustment value corresponding to a rounded distance from the mapping table.

In an embodiment, the distance between the human body and the terminal is a closest distance between the human body and a strongest radiation point of the terminal.

In an embodiment, the acquiring module 10 described above can be implemented as a sensor, and both the retrieve module 20 and the adjustment module 30 can be implemented with a CPU (Central Processing Unit) in the terminal.

Figure 4:
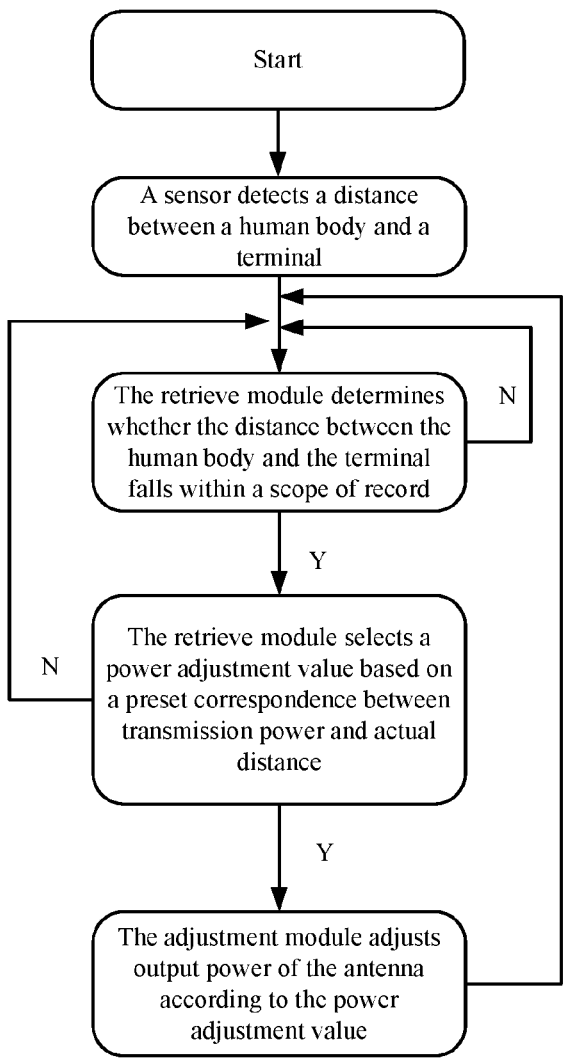
FIG. 4 is a flow chart illustrating a workflow for adjusting transmission power of a terminal.

A workflow example of the apparatus is as shown in FIG. 4. The distance between a user's human body and the terminal is detected when the terminal is used to conduct conversation or internet service. When the distance is greater than a maximum distance requiring reduction of power (for example, the maximum distance is 8 mm, that is, even the greatest SAR value will fall within a permitted range when the terminal works at a distance greater than 8 mm to the human body), it can be considered as that there is no human body detected nearby the terminal. Accordingly, the terminal may not perform any operation but go on with the determination.

When the distance detected between the user's human body and the terminal is less than the maximum distance recorded in the table, which inevitably falls within a range from 0 mm to 8 mm (8 mm is only used for illustration), a value of the distance is rounded off. For example, when the distance measured between the terminal and the user's human body is 2.2 mm, it can be rounded off as 2 mm for ensuring effectiveness of power adjustment.

On the other hand, there are eight power adjustment values corresponding to different distances obtained through SAR test in the laboratory. For example, the transmission power needs to be reduced by 4 dB at a test distance of 1 mm, the transmission power needs to be reduced by 3.5 dB at a test distance of 2 mm, the transmission power needs to be reduced by 3 dB at a test distance of 3 mm, and so on.

Through the method described above, a corresponding power adjustment value can be selected in real time based on the actual distance between the human body and the terminal. For example, when the distance between the human body and the terminal is 3 mm, the power adjustment value to be subtracted from the transmission power is 3 dB according to the test result of laboratory. Accordingly, the transmission power of terminal antenna is reduced by 3 dB before further transmission, such that the SAR value at the user's position will undoubtedly meet the standard.

At the same time, the distance from the human body to the terminal is continuously tested and determined by the sensor, and the process described above is performed repeatedly.

A terminal is further provided by embodiments of the disclosure, which includes the apparatus for adjusting transmission power of terminal described in the embodiments described above.

Functions and process flow of the terminal provided in the embodiments can be learned with reference to the embodiments of the apparatus for adjusting transmission power of terminal described above, which may be not elaborated herein.

As can be seen from above description, according to the apparatus for adjusting transmission power of the terminal as well as the terminal provided by the embodiment, the current distance between the human body and the terminal is acquired, the power adjustment value corresponding to the distance is retrieved, and the transmission power of the antenna is then reduced based on the retrieved power adjustment value. In this way, antenna power output by the terminal is adjusted in real time according to the current distance between the human body and the terminal such that transmission power of the terminal antenna can be adjusted to be provided with a SAR value conforming to prescribed standard, for protection purpose of the user from antenna radiation, without influencing normal use of the terminal. Moreover, there is no requirement for extra spare or wiring area of antenna in terms of antenna design, so the circuit layout of terminal will not be affected, and a brief operation is available with a simple mechanism.

It should be appreciated by those skilled in the art that, all or part of steps for implementing the embodiments of method described above may be performed by related hardware with instructions from a program. The program may be stored in computer readable storage medium. When the program is executed, those steps in various embodiments of the method can be performed. The storage medium includes a variety of medium being able to store program code, such as ROM, RAM, magnet disk or optical disk.

It should be noted that the above embodiments are described only for purpose of illustrating technical solution of the invention instead of limiting the invention. It will be appreciated by those skilled in the art that the present invention is not limited to the detailed description that has been described above, and that various modifications can be made to the technical solution described in the embodiments and various equivalents can be substituted for part or all of technical features therein without substantially departing from scope of the technical solution in the various embodiments.

We claim:

1. A method for adjusting transmission power of a terminal, comprising:
    acquiring a distance between a human body and the terminal;
    determining whether the acquired distance is smaller than a maximum distance recorded in a prestored table indicative of correspondence between distances and power adjustment values to obtain a result; rounding the acquired distance when the result indicates that the distance is smaller than the maximum distance recorded in the table, and returning to the acquiring the distance between the human body and the terminal when the result indicates otherwise; retrieving a power adjustment value corresponding to a rounded distance from the table; and
    adjusting transmission power of the terminal based on the power adjustment value.

2. The method as claimed in claim 1, wherein the acquiring a distance between a human body and the terminal comprises:
    acquiring the distance between the human body and the terminal by using a sensor provided in the terminal.

3. The method as claimed in claim 2, wherein the table comprises distances between the human body and the terminal and corresponding power adjustment values.

4. The method as claimed in claim 1, wherein the distance between the human body and the terminal is a closest distance between the human body and a strongest radiation point of the terminal.

5. An apparatus for adjusting transmission power of a terminal, comprising:
    a processor; and
    a memory configured to store instructions executable by the processor;
    wherein, the processor is configured to perform:
    acquiring a distance between a human body and the terminal;
    determining whether the acquired distance is smaller than a maximum distance recorded in a prestored table indicative of correspondence between distances and power adjustment values to obtain a result; rounding the acquired distance when the result indicates that the distance is smaller than the maximum distance recorded in the table, and returning to the acquiring the distance between the human body and the terminal when the result indicates otherwise; retrieving a power adjustment value corresponding to a rounded distance from the table; and
    adjusting transmission power of the terminal based on the power adjustment value.

6. The apparatus as claimed in claim 5, wherein in the acquiring a distance between a human body and the terminal, the processor is further configured to perform:
    acquiring the distance between the human body and the terminal by using a sensor provided in the terminal.

7. The apparatus as claimed in claim 6, wherein the table comprises distances between the human body and the terminal and corresponding power adjustment values.

8. The apparatus as claimed in claim 5, wherein the distance between the human body and the terminal is a closest distance between the human body and a strongest radiation point of the terminal.

9. A non-transitory computer-readable storage medium having stored therein instructions that, when executed by a processor of a terminal, causes the terminal to perform a method for adjusting transmission power, the method comprising:
    acquiring a distance between a human body and the terminal;
    determining whether the acquired distance is smaller than a maximum distance recorded in a prestored table indicative of correspondence between distances and power adjustment values to obtain a result; rounding the acquired distance when the result indicates that the distance is smaller than the maximum distance recorded in the table, and returning to the acquiring the distance between the human body and the terminal when the result indicates otherwise; retrieving a power adjustment value corresponding to a rounded distance from the table; and
    adjusting transmission power of the terminal based on the power adjustment value.

* * * * *